United States Patent [19]
Van Roessel

[11] Patent Number: 4,587,439
[45] Date of Patent: May 6, 1986

[54] PULSE GENERATOR COMPRISING AT LEAST TWO VOLTAGE COMPARISON CIRCUITS

[75] Inventor: Frederik J. Van Roessel, Upper Saddle River, N.J.

[73] Assignee: U.S. Philips Corporation, New York, N.Y.

[21] Appl. No.: 454,213

[22] Filed: Dec. 29, 1982

[30] Foreign Application Priority Data

Jan. 22, 1982 [NL] Netherlands ............... 8200235

[51] Int. Cl.⁴ .................. H03K 5/04; H03K 3/023
[52] U.S. Cl. .................................. 307/265; 307/351; 307/261; 307/268; 328/117; 328/61
[58] Field of Search ............... 307/350, 351, 355, 357, 307/360, 362, 260, 261, 271, 273, 265, 268; 328/115, 116, 117, 193, 59–61

[56] References Cited

U.S. PATENT DOCUMENTS

3,585,507  6/1971  Bickel ................................ 328/116

OTHER PUBLICATIONS

Peak-Discriminator-Controlled Sampling of Multi-Unit Spike Trains, Reducing Storage Requirements, J. N. van der Molen et al., 9/78, Medical and Biological Engineering and Computing.

National Semiconductor Linear Data Book, copyright 1976, National Semiconductor.

*Primary Examiner*—Stanley D. Miller
*Assistant Examiner*—Richard Roseen
*Attorney, Agent, or Firm*—Thomas A. Briody; William J. Streeter; Marianne Rich

[57] ABSTRACT

A pulse generator for generating pulses having pulse edges at instants at which a varying amplitude input voltage is equal to one of at least two threshold values produced by a voltage source. The pulse generator has at least two voltage comparison circuits each having first and second outputs, first and second inputs for receiving voltages to be compared and third and fourth inputs for receiving blocking voltages applied thereto. The blocking voltages block the transmission of signals to the first and second comparison outputs of each voltage comparison circuit. One of the first or second inputs of each voltage comparison circuit is coupled to the pulse generator, while the other is coupled to the voltage source. The outputs of the voltage comparison circuits are coupled to each other and to the output of the pulse generator by diodes. The diodes connected to the first voltage comparison circuit are biased separately from those connected to the second voltage comparison circuit.

6 Claims, 1 Drawing Figure

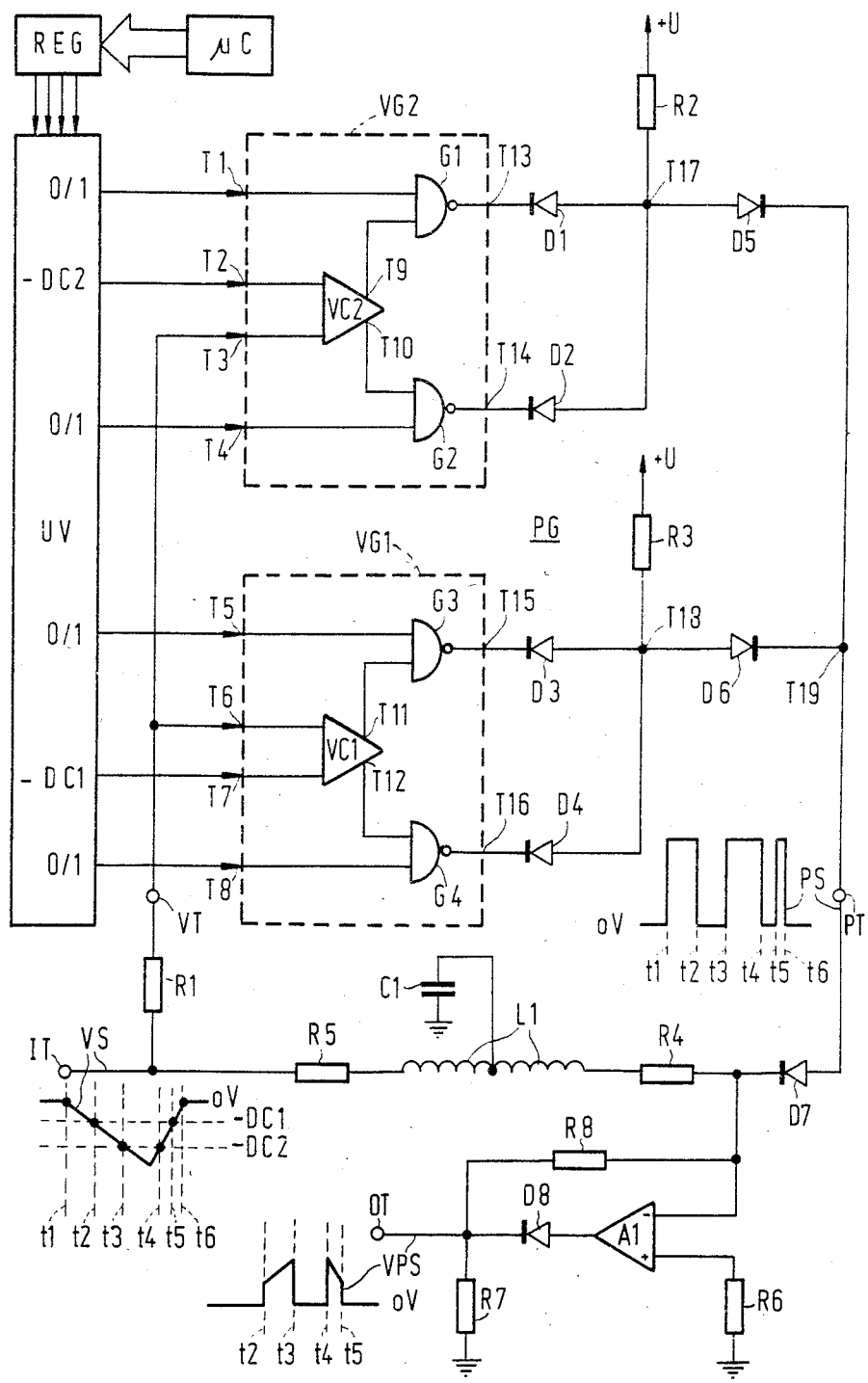

PULSE GENERATOR COMPRISING AT LEAST TWO VOLTAGE COMPARISON CIRCUITS

BACKGROUND OF THE INVENTION

The invention relates to a pulse generator comprising at least two voltage comparison circuits and having an input for receiving a variable input voltage and an output for supplying pulses having pulse edges occurring at instants at which the instantaneous input voltage value is substantially equal to one of at least two threshold values to be supplied by a voltage source and present at the voltage comparison circuits.

Such a pulse generator is disclosed in U.S. Pat. No. 3,711,642, the pulses being used to obtain equidensity lines in a picture obtained on the display screen of a display device under the control of said input voltage. In said patent the pulse generator comprises diodes which are biased to different threshold values from the voltage source, which diodes become conductive when the varying voltage is applied to them, at the instants and result in conjunction with switches controlled thereby in the pulse generation.

SUMMARY OF THE INVENTION

The invention has for its object to provide a pulse generator comprising predominantly binary components, the pulse edge instants being accurately fixed in time and it being possible to generate, in a simple switchable manner, pulses which are associated with instantaneous input voltages located at, above, below or between the at least two threshold values present. According to the invention, an embodiment of the pulse generator is characterized in that each voltage comparison circuit has first and second outputs, first and second inputs for receiving two voltages to be compared and third and fourth inputs for receiving blocking voltages for blocking the voltage comparison circuits between the first and second inputs and the first and second outputs, respectively, the first or the second input of each voltage comparison circuit being coupled to the input of the pulse generator and the further inputs to the voltage source, and the outputs of the voltage comparison circuits being coupled to each other and to the output of the pulse generator via diodes which are separately biased for each voltage comparison circuit.

A simple construction of a switchable pulse generator having pulse edges at the threshold values which are partly fixed, partly adjustable, with chosen directions, is characterized in that the third and fourth inputs of the voltage comparison circuits are each separately connected to an output of the voltage source for supplying two switchable voltage values corresponding to a logic 0 and 1.

A further embodiment is characterized in that for controlling the voltage source having the outputs for supplying the two switchable voltage values, said voltage source has inputs which are connected to outputs of a register which is connected to a microcomputer.

A simple coupling of the outputs of the voltage comparison circuits to the output of the pulse generator is accomplished in a pulse generator which is characterized in that the first and second outputs of the voltage comparison circuits are each connected via a first and a second diode, respectively having the same forward directions, to a junction point between a voltage-carrying resistor and a third diode having the same forward direction relative to the junction point, the other terminal of the third diode being connected to the output of the pulse generator.

DESCRIPTION OF THE DRAWING

The invention will now be further described by way of example with reference to the accompanying drawing which shows an embodiment of a pulse generator according to the invention provided in a signal level selection circuit.

DESCRIPTION OF THE PREFERRED EMBODIMENT

An input of a pulse generator PG in accordance with the invention, shown in the drawing, is denoted by VT and an output by PT. The pulse generator PG forms part of a signal level selection circuit, an input of which is denoted by IT and an output by OT, a microcomputer $\mu C$ and a register REG controlled therefrom also being present. The register REG has a number of outputs, for example four, which are connected to inputs of a voltage source UV. The voltage source UV forms part of the pulse generator PG and has a number of outputs, for example, six. Adjustable threshold voltages, referenced $-DC1$ and $-DC2$, respectively, are shown next to two outputs. At the other four outputs, it is indicated by O/1 that they may supply a lower and a higher positive d.c. voltage which corresponds to logic 0 and 1, respectively. A combination of logic 0's and 1's determined by the register REG under the control of the microcomputer $\mu C$, is present on the O/1 outputs of the voltage source UV.

In the drawing, at the input IT of the signal level selection circuit, there is shown, by way of example, a signal VS as a function of the time to be applied to this terminal. The signal VS is, for example, a video signal for black-white television or color television. Some instants are denoted by t1 to t6, inclusive. The signal VS when used as a video signal has line blanking periods and line scanning periods, the black level which has the ground potential of OV occurring in the line blanking period which ends at the instant t1 and in the subsequent line blanking period which starts at the instant t6. The line scanning period has a duration from the instant t1 to the instant t6 and in that period of time the signal VS has a voltage variation, shown by way of example as a linear variation, between the black level and a peak white value which is reached between the instants t3 and t4. The adjustable threshold voltages $-DC1$ and $-DC2$ are shown in the illustration of the signal VS, these values being present in the signal VS at the instants t2, t5 and t3, t4, respectively. A video signal is shown as an example of the input signal VS, which input signal VS may further have any arbitrary negatively-going voltage variation. Positively-going voltage variations and positive threshold values may alternatively be present.

The drawing further shows, as a function of the time, a signal PS at the output PT of the pulse generator PG and a signal VPS at the output OT of the signal level selection circuit. When the input signal VS is applied to the input VT via a resistor R1, the pulse generator PG applies, in a manner still further to be described, the signal PS having the pulse-shaped voltage variation to the output PT. A combination of the signals VS and PS results, in a manner still further to be described, in the signal VPS.

From the shown voltage variation of the signal VPS it can be seen that a threshold-limiter circuit is incorporated in the signal level selection circuit. Comparing the signals VS and VPS shows that between the two threshold values −DC1 and −DC2 the circuit passes the signal applied to the signal and that it is blocked at less negative values (before the instant t2 and after the instant t5) and at more negative values (between the instants t3 and t4) during the line scanning period between the instants t1 and t6. It will be seen that in the shown embodiment of the signal level selection circuit, there can be distinguished, in addition to the described threshold-limiter circuit operative between the values −DC1 and −DC2, two further threshold-limiter circuits which are operative between the OV ground potential and the value −DC1 and −DC2, respectively, and a threshold circuit which operates with more negative values then the value −DC2. In this situation, let it be assumed that a limited peak white value is applied. In addition, the OV ground potential must also be considered as being a threshold value which results from the construction of the generator PG. In a clamping circuit, not shown, which precedes the input IT the black level in the signal VS is clamped on the OV ground potential.

The input signal VS coming from the input IT is applied via the resistor R1 and the input VT to two voltage comparators VC1 and VC2, which are incorporated in the pulse generator PG, more specifically to inputs T6 and T3, respectively, of the voltage comparators VC1 and VC2, respectively. A further input T7 of the voltage comparator VC1 is connected to the output of the voltage source UV which produces the adjustable d.c. voltage −DC1 as a threshold voltage. Likewise a further input T2 of the voltage comparator VC2 is connected to the output of the voltage source UV which carries the adjustable d.c. voltage −DC2. The voltage comparators VC1 and VC2 each have two inverse outputs denoted by T9, T10 and T11, T12, respectively. When at the input T3 there is a voltage which is less negative than the voltage on the input T2, that is to say the voltage on the output T3 is positive with respect to the voltage on the input T2, the output T9 carries a high positive voltage corresponding to the logic 1 and output T10 carries a low positive voltage corresponding to the logic 0. The inputs T6 and T7 of the voltage comparator VC1 correspond to the respective inputs T2 and T3 of the comparator VC2, the outputs T11 and T12 correspond in like manner to the outputs T9 and T10. Put differently, the varying voltage between the inputs T2, T3 and T6, T7, respectively is present in the inverted form as a constant voltage between the outputs T9, T10 and T11, T12, respectively.

The outputs T9, T10, T11 and T12, respctively are connected to inputs of respective NAND-gates G1, G2, G3 and G4. A further input of each gate G1, G2, G3 and G4 is connected to a respective further output of the voltage source UV. The voltage comparator VC1 and the gates G3 and G4 form together a voltage comparison circuit VG1, the inputs of the gates G3 and G4 connected to the voltage source UV constitute inputs T5 and T8 of the voltage comparison circuit VG1. The same holds for a voltage comparison circuit VG2 having inputs T1 and T4, which are connected to the gates G1 and G2. The voltage comparison circuits VG2 and VG1, each having two outputs T13, T14 and T15, T16, respectively, which are connected to the outputs of the gates incorporated in said comparison circuits, are commercially available as integrated circuits marketed by Signetics with the type indication NE 529N. The voltage comparison circuit VG2 has a first input T2 and a second input T3 to receive two voltages to be compared and has a third input T1 and a fourth input T4 for applying thereto blocking voltages for blocking the circuit VG2 between the first and second inputs T2 and T3 and a first output T13 and a second output T14, respectively. A similar description holds for the voltage comparison circuit VG1.

Under the control of information coming from the register REG, which is, in turn, controlled by the microcomputer μC, the voltage source UV applies combinations of logic 1's and logic 0's to the inputs T1, T4, T5 and T8. The predetermined combination determines, as will be described hereinafter, in association with the threshold voltage values −DC1 on the input T7 and −DC2 on the input T2, which portions of the signal VS applied to the inputs T3 and T6 will be selected or suppressed in the threshold-limiter circuit. In response to a logic 0 applied to the gate G1, G2, G3 or G4 via the respective inputs T1, T4, T5 or T8, the path from the voltage comparison inputs T2, T3 and T6, T7 to the respective outputs T13, T14, T15 and T16 is blocked.

The outputs T13 and T14, respectively, of the circuit VG2 are connected to the cathodes of diodes D1 and D2, respectively, whose anodes are interconnected at a junction point T17 and are connected via a resistor R2 to a terminal carrying a voltage +U. The terminal carrying the voltage +U forms part of a voltage source, not shown, a further terminal of which is connected to ground. The outputs T15 and T16, respectively, of the comparison circuit VG1 are connected to the cathodes of diodes D3 and D4, respectively, whose anodes are interconnected at a junction point T18 and are connected via a resistor R3 to the terminal carrying the voltage +U. The anodes of the diodes D1, D2 and D3, D4, respectively are connected to anodes of diodes D5 and D6, respectively, whose cathodes are interconnected at a junction point T19. The diodes D1, D2 and D5 which are arranged with the same forward directions relative to the junction point T17 are biased by means of the resistor R2, the diodes D3, D4, and D6 being biased in a similar way via the resistor R3. The junction point R19 of the diodes D5 and D6 is connected to the output PT of the pulse generator PG. Diodes D1, D2 and D3, D4 constitute first and second logic circuits, respectively, while diodes 5 and 6 constitute a third logic circuit.

The junction point T19 of the diodes D5 and D6, which point is connected to the output PT of the pulse generator PG, is connected to the anode of a diode D7. The cathode of the diode D7 is connected to a resistor R4 and to a (−) input of a differential amplifier A1. By means of a further terminal, the resistor R4 is connected to a coil L1, a further terminal of which is connected to the input IT via a resistor R5. A center tap of the coil L1 is connected to ground via a capacitor C1. The diode D7 and the resistor R4 form an adder circuit (D7, R4) to which the signal VS is applied via a delay circuit (L1, C1, R5). The delay circuit (L1, C1, R5) serves to compensate for the delays occurring in the pulse-shaped signal PS relative to the signal VS. At the indicated instants t1 and t6, inclusive this delay is disregarded for the sake of simplicity.

The adder circuit (D7, R4) has its output connected to the (−) input of the amplifier A1. The (+) input of the amplifier A1 is connected to ground via a resistor R6, the amplifier output being connected via a diode D8 to the junction point of a resistor R7 leading to ground and a resistor R8 leading to the (−) amplifier input. This junction point is connected to the output OT of the signal level selection circuit thus described.

The amplifier A1, the diode D8 and the resistors R6, R7 and R8 form a half-wave rectifier circuit (A1, D8, R6, R7, R8), as only negative voltages at the (−) amplifier input result in a positive voltage at the cathode of the diode D8. When a positive voltage is applied to the (−) input of the amplifier A1, this amplifier produces a negative amplifier output voltage, the diode D8 being cut-off and the cathode thereof supplying the OV ground potential. The rectifier circuit (A1, D8, R6, R7, R8) is then made inoperative. Comparing the signals VS, PS and and VPS will show that the positively directed pulses in the signal PS added to the signal VS put the rectifier circuits (A1, D8, R6, R7, R8) out of operation. Consequently, a threshold limiter circuit (PG, A1, D8) is formed in the drawing.

To explain the signal detection by means of the pulse generator PG the following Table is used.

TABLE 1

The variation of the signal VS relative to the threshold values −DC1 and −DC2 and the resulting logic values

|  | T3 | T6 | T9 | T10 | T11 | T12 |
|---|---|---|---|---|---|---|
| 0/VS/−DC1 | H | H | 1 | 0 | 0 | 1 |
| −DC1/VS/−DC2 | H | L | 1 | 0 | 1 | 0 |
| −DC2/VS | L | L | 0 | 1 | 1 | 0 | wherein H indicates a less negative voltage and L a more negative voltage relative to the negative threshold value.

Reading Table 1 from the top to the bottom, it holds for the signal VS that the period considered extends from prior to instant t1 to just prior to the instant t4 in the voltage variation. If Table 1 is read from the bottom to the top then it holds for the signal VS shown that the voltage variation is considered from after the instant t3 to after the instant t6.

The biased diodes D1, D2 and D3, D4, respectively, correspond to a logic AND function. An OR-function holds for the diodes D5 and D6.

From Table 2, which shows the selection codes and their results, it follows that at the code 1, a positive pulse would occur in the signal PS at the output PT (point T19) from the instant t2 to the instant t5, inclusive. This results in the rectifier circuit (A1, D8, R6, R7, R8) passing the signal VS only at the signal values which are less negative than the threshold value −DC1.

The code 2 results in three positive pulses, namely between the instants t1 and t2, t3 and t4 and t5 and t6. The signal PS shown corresponds therewith. Only video signal values located between the threshold values −DC1 and −DC2 are conveyed further.

The code 3 would result in two positive pulses in the signal PS at the output PT (point T19) between the instants t1 and t3 and t4 and 56. Now only the signal values which are more negative than the threshold value −DC2 are conveyed further.

The code 4 would result in a positive pulse in the signal PS at the output PT (point T19) between the instants t3 and t4. All video signal values less negative than the threshold value −DC2 are then conveyed further.

It has been found that with the four codes 1001, 1010, 0110 and 1011 at the inputs T1, T4, T5 and T8 and the choice of the adjustable threshold values −DC1 and −DC2, the pulse generator PG operates as a simple switchable pulse generator which can, for example, be employed for signal level selection. The use of the signal comparison circuits VG1 and VG2 in the form of binary switching components results in the pulse edge instants t1 to t6, inclusive in the signal PS being accurately fixed in the time, starting from the input signal VS with the voltage variation shown. The simple level selection at the pulse generation is obtained by blocking the path between the inputs T2, T3 and T6, T7 respectively, and the outputs T13, T14, T15 and T16, respectively, via the inputs T1, T4, T5 and T8. It is then sufficient to apply the logic 0 to the gates G1, G2, G3 and G4 connected to the relevant inputs.

From inter alia the voltage variation shown of the signal PS, it has been found that in addition to the threshold values −DC1 and −DC2 produced by the voltage source UV, the OV ground potential is present as a further threshold value which results from the structure of the circuit of the pulse generator PG.

What is claimed is:

1. In pulse generator apparatus comprising a voltage source furnishing at least two threshold values, and a pulse generator having said threshold values applied thereto and having a pulse generator input for receiving a variable amplitude input voltage and a pulse generator output for supplying pulses having pulse edges occurring at instants at which the instantaneous input voltage value corresponds to one of said threshold values, said pulse generator comprising at least two voltage comparison circuits, the improvement wherein each of said voltage comparison circuits has a first and second comparison output, a first and second

TABLE 2

| four selection codes and their results. | | | | | | | | | | | | | | | |
|---|---|---|---|---|---|---|---|---|---|---|---|---|---|---|---|
| 1 | | | | 2 | | | | 3 | | | | 4 | | | |
| T1 | T4 | T5 | T8 | T1 | T4 | T5 | T8 | T1 | T4 | T5 | T8 | T1 | T4 | T5 | T8 |
| 1 | 0 | 0 | 1 | 1 | 0 | 1 | 0 | 0 | 1 | 1 | 0 | 1 | 0 | 1 | 1 |
| T13 | T14 | T15 | T16 | T13 | T14 | T15 | T16 | T13 | T14 | T15 | T16 | T13 | T14 | T15 | T16 |
| 0 | 1 | 1 | 0 | 0 | 1 | 1 | 1 | 1 | 1 | 1 | 1 | 0 | 1 | 1 | 0 |
| 0 | 1 | 1 | 1 | 0 | 1 | 0 | 1 | 1 | 1 | 0 | 1 | 0 | 1 | 0 | 1 |
| 1 | 1 | 1 | 1 | 1 | 1 | 0 | 1 | 1 | 0 | 0 | 1 | 1 | 1 | 0 | 1 |
| T17 | | T18 | | T17 | | T18 | | T17 | | T18 | | T17 | | T18 | |
| 0 | | 0 | | 0 | | 1 | | 1 | | 1 | | 0 | | 0 | |
| 0 | | 1 | | 0 | | 0 | | 1 | | 0 | | 0 | | 0 | |
| 1 | | 1 | | 1 | | 0 | | 0 | | 0 | | 1 | | 0 | |
| T19 | | | | T19 | | | | T19 | | | | T19 | | | |
| 0 | | | | 1 | | | | 1 | | | | 0 | | | |
| 1 | | | | 0 | | | | 1 | | | | 0 | | | |
| 1 | | | | 1 | | | | 0 | | | | 1 | | | | comparison input for receiving two voltages to be compared and third and fourth comparison inputs for receiving blocking voltages for blocking the transmission of signals to said first and second comparison output, respectively;

wherein one of said first or said second comparison inputs of each of said voltage comparison circuits is coupled to said pulse generator input, the other of said first or second comparison inputs being coupled to said voltage source, the first and second comparison outputs of each voltage comparison circuit being coupled to each other and to said pulse generator output at least in part via logic elements operating independently for each voltage comparison circuit.

2. A pulse generator as claimed in claim 1, wherein said voltage source further supplies switchable voltage values corresponding to a logic 0 and 1 at respective outputs thereof; and wherein said third and fourth inputs of the voltage comparison circuit are each connected to outputs supplying said one of said switchable voltage values.

3. A pulse generator as claimed in claim 1, further comprising means for blocking portions of said variable amplitude input voltage occurring within the duration of said pulses having said pulse edges, thereby creating a sampled variable input signal.

4. A pulse generator as claimed in claim 3, wherein said means for blocking portions of said input signal comprises means for combining said variable amplitude input voltage and said output pulses thereby generating a combined signal; and discriminator means connected to said combining means for generating a discriminator output signal only in response to portions of said combined signal having a predetermined polarity, said discriminator output signal constituting said sampled variable input signal.

5. A pulse generator comprising at least two voltage comparison circuits and having a pulse generator input for receiving a variable amplitude input voltage and a pulse generator output for supplying pulses having pulse edges occurring at instants at which the instantaneous input voltage value corresponds to one of at least two threshold values to be supplied by a voltage source and present at the voltage comparison circuits, characterized in that each voltage comparison circuit has a first and second comparison output, a first and second comparison input for receiving two voltages to be compared and third and fourth comparison inputs for receiving blocking voltages for blocking the transmission of signals to the first and second comparison outputs, respectively, one of the first or the second comparison inputs of each voltage comparison circuit being coupled to said pulse generator input, the other of said first or second comparison inputs being coupled to the voltage source and the outputs of each of the voltage comparison circuits being coupled to each other and to the output of the pulse generator via respective, separately biased diodes, and wherein said voltage source has a plurality of inputs;

further comprising a microcomputer and a register connected to said microcomputer, said register having register outputs connected to said inputs of said voltage source.

6. A pulse generator as claimed in claim 5, wherein said diodes are connected as AND circuits.

* * * * *